(12) United States Patent
Ide

(10) Patent No.: US 11,343,941 B2
(45) Date of Patent: May 24, 2022

(54) ELECTRONIC DEVICE, CONTROL DEVICE, AND CONTROL METHOD

(71) Applicant: SHARP KABUSHIKI KAISHA, Sakai (JP)

(72) Inventor: Tomoya Ide, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/022,631

(22) Filed: Sep. 16, 2020

(65) Prior Publication Data

US 2021/0105909 A1 Apr. 8, 2021

(30) Foreign Application Priority Data

Oct. 7, 2019 (JP) .............................. JP2019-184695

(51) Int. Cl.
*H04N 5/232* (2006.01)
*H04N 5/225* (2006.01)
*H05K 7/20* (2006.01)
*G03B 17/55* (2021.01)

(52) U.S. Cl.
CPC .......... *H05K 7/2039* (2013.01); *G03B 17/55* (2013.01); *H04N 5/2257* (2013.01); *H04N 5/22521* (2018.08); *H04N 5/23245* (2013.01)

(58) Field of Classification Search
CPC ............. H04N 5/22521; H04N 5/2257; H04N 5/23245; G03B 17/55; H05K 7/2039; H05K 7/20436; H05K 7/20445; H05K 7/20472; H05K 7/20954; H05K 7/20963
See application file for complete search history.

(56) References Cited

U.S. PATENT DOCUMENTS

| | | | |
|---|---|---|---|
| 2013/0037533 A1* | 2/2013 | Namekawa | G01K 3/14 219/494 |
| 2015/0003018 A1 | 1/2015 | Takahashi et al. | |
| 2015/0049243 A1* | 2/2015 | Samuels | G03B 17/55 348/374 |
| 2017/0068292 A1* | 3/2017 | Hooton | G06F 1/203 |
| 2018/0107099 A1* | 4/2018 | Yasuda | H04N 5/22521 |
| 2018/0267390 A1* | 9/2018 | Kim | G03B 17/55 |
| 2020/0128690 A1 | 4/2020 | Ide | |
| 2020/0214167 A1* | 7/2020 | Hatano | H05K 7/20454 |

FOREIGN PATENT DOCUMENTS

JP 6315229 B2 4/2018

* cited by examiner

*Primary Examiner* — Daniel M Pasiewicz
(74) *Attorney, Agent, or Firm* — ScienBiziP, P.C.

(57) ABSTRACT

An electronic device includes: a first heat absorber that absorbs heat of a first heat generating source composed of a first heat generating component generating heat inside the electronic device, and operating during substantially an entire period of an operation period during which the electronic device is configured to receive an input operation of a user on a screen of the electronic device; and a second heat absorber that absorbs heat of a second heat generating source composed of a second heat generating component and that is disposed at a position separated from the first heat absorber, the second heat generating component operating during a part of the operation period.

11 Claims, 4 Drawing Sheets

ELECTRONIC DEVICE, CONTROL DEVICE, AND CONTROL METHOD

CROSS-REFERENCE TO RELATED APPLICATION

The present application claims priority from Japanese Application JP2019-184695, the content of which is hereby incorporated by reference into this application.

BACKGROUND OF THE INVENTION

1. Field of the Invention

The present disclosure relates to an electronic device, a control device, and a control method.

2. Description of the Related Art

In the related art, research on heat dissipation of electronic devices has been made. Japanese Patent No. 6315229 (registered Apr. 6, 2018) discloses an electronic device including a heat dissipation component having a plurality of heat absorbing units provided corresponding to the number of a plurality of electronic components and a heat dissipation unit that is thermally connected to each of the plurality of heat absorbing units, in order to absorb heat from the plurality of electronic components.

SUMMARY OF THE INVENTION

In the electronic device disclosed in Japanese Patent No. 6315229 (registered Apr. 6, 2018), the heat from the plurality of electronic components simultaneously transfers to the heat dissipation unit via the plurality of heat absorbing units, and the temperature of the heat dissipation unit easily rises. Therefore, in the electronic device, there is a problem that a temperature difference between the temperature of the plurality of electronic components and the temperature of the heat dissipation unit becomes small, and the heat from the plurality of electronic components hardly transfers to the heat dissipation unit. According to an aspect of the present disclosure, it is desirable to easily implement a configuration for sufficiently absorbing and dissipating heat of a heat generating component.

According to an aspect of the present disclosure, there is provided an electronic device including: a first heat absorber that absorbs heat of a first heat generating source composed of a first heat generating component generating heat inside the electronic device, and operating during substantially an entire period of an operation period during which the electronic device is configured to receive an input operation of a user on a screen of the electronic device; and a second heat absorber that absorbs heat of a second heat generating source composed of a second heat generating component and that is disposed at a position separated from the first heat absorber, the second heat generating component operating during a part of the operation period.

According to another aspect of the present disclosure, there is provided a control device that controls an electronic device including a camera module for capturing an image of an object and an antenna module for communicating with an outside of the electronic device. The control device includes: a camera control unit that controls the camera module according to a first temperature of the camera module and a second temperature of a heat absorber that absorbs heat of the camera module and the antenna module; and an antenna control unit that controls the antenna module according to a third temperature of the antenna module and the second temperature.

According to still another aspect of the present disclosure, there is provided a control method of an electronic device including a camera module for capturing an image of an object and an antenna module for communicating with an outside of the electronic device, the method including: controlling the camera module according to a first temperature of the camera module and a second temperature of a heat absorber that absorbs heat of the camera module and the antenna module; and controlling the antenna module according to a third temperature of the antenna module and the second temperature.

According to an aspect of the present disclosure, it is possible to easily implement a configuration for sufficiently absorbing and dissipating heat of a heat generating component.

DETAILED DESCRIPTION OF THE INVENTION

Embodiment 1

Configuration of Electronic Device 1

Figure 1:
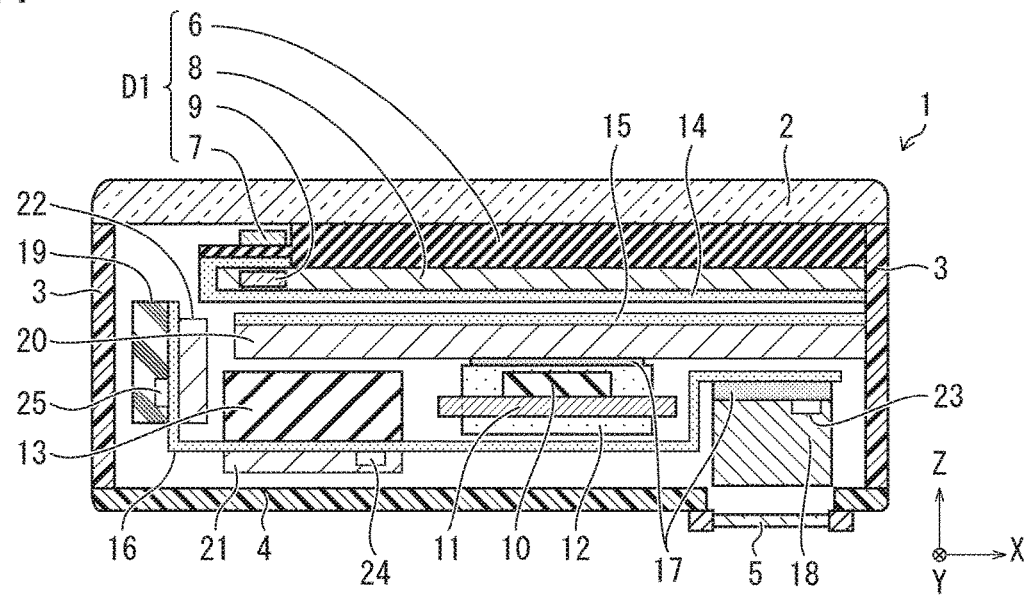
FIG. 1 is a cross-sectional view showing a cross-sectional configuration according to an example of an electronic device according to Embodiment 1 of the present disclosure.

FIG. 1 is a cross-sectional view showing a cross-sectional configuration according to an example of an electronic device 1 according to Embodiment 1 of the present disclosure. The electronic device 1 is, for example, a mobile multifunctional information processing terminal (mobile terminal) such as a smartphone or a tablet. The electronic device 1 may not include a third metal plate 22 described below.

As shown in FIG. 1, the electronic device 1 includes a cover glass 2, side surface members 3, a back surface member 4, a lens 5, a liquid crystal unit 6, a driver circuit 7, a backlight unit 8, a light emitting diode (LED) 9, a control device 10, a substrate 11, a shield case 12, a battery 13, first heat dissipation sheets 14 and 15, a second heat dissipation sheet 16, a thermal conductive member 17, a camera module 18, an antenna module 19, a first metal plate 20 (first heat absorber), a second metal plate 21 (second heat absorber, heat absorber), a third metal plate 22, a first thermistor 23, a second thermistor 24, and a third thermistor 25.

The cover glass 2 is a member that constitutes the front surface of the electronic device 1, and is glass that is configured to allow a user to visually recognize an image displayed by the liquid crystal unit 6. The cover glass 2 is provided above the liquid crystal unit 6 (the positive direction of a Z axis) and covers the driver circuit 7.

The side surface members 3 constitute side surfaces of the electronic device 1, and are provided between the cover glass 2 and the back surface member 4. For example, the side surface member 3 may be made of the same material as the cover glass 2 or the back surface member 4, or may be made of resin or glass. For example, by providing four side surface members 3, the electronic device 1 has four side surfaces. The four side surfaces are composed of two side surfaces extending in a longitudinal direction (X axis direction) of the electronic device 1 and two side surfaces extending in a lateral direction (Y axis direction) of the electronic device 1.

The back surface member 4 is a member constituting the back surface of the electronic device 1. The back surface member 4 is made of resin, for example. The cover glass 2, the side surface member 3, and the back surface member 4 are members that protect the inside of the electronic device 1. The cover glass 2, the side surface member 3, and the back surface member 4 form a housing of the electronic device 1. In this case, the cover glass 2, the side surface member 3, and the back surface member 4 constitute the surface of the housing of the electronic device 1.

The cover glass 2, the side surface member 3, and the back surface member 4 are portions that are easily touched by the user's hand when gripping or operating the electronic device 1. Therefore, the cover glass 2, the side surface member 3, and the back surface member 4 are made of a material having a thermal conductivity lower than that of at least the first metal plate 20, the second metal plate 21, and the third metal plate 22.

Thereby, when the user's hand touches any of the cover glass 2, the side surface member 3, and the back surface member 4, it is possible to reduce the user's feeling of heat. The lens 5 is made of, for example, glass or plastic resin. The lens 5 is disposed below the camera module 18 built in the electronic device 1 (in the negative direction of the Z axis).

The liquid crystal unit 6 includes a liquid crystal panel that displays an image and the like. The driver circuit 7 is a liquid crystal driver circuit that controls driving of the liquid crystal unit 6 to control image display on the liquid crystal unit 6. The backlight unit 8 guides light from the LED 9 to the liquid crystal unit 6.

In the present embodiment, a display panel D1 is constituted by the liquid crystal unit 6, the driver circuit 7, the backlight unit 8, and the LED 9, but the present disclosure is not limited thereto. For example, the display panel D1 may include an organic light emitting diode (OLED) and a driver circuit (corresponding to the driver circuit 7) that controls driving of the OLED.

The display panel D1 may include, for example, an inorganic light emitting diode or a quantum dot light emitting diode (QLED) instead of the OLED. The display panel D1 may include the liquid crystal unit 6 and the driver circuit 7, but may not include the backlight unit 8 and the LED 9.

The control device 10 centrally controls each component included in the electronic device 1, and includes, for example, a central processing unit (CPU) and a graphics processing unit (GPU). The control device 10 is disposed on the substrate 11 and is sealed by the shield case 12 that shields electromagnetic waves from the control device 10 or the outside. The shield case 12 is made of metal, for example. The number of control devices 10 may be one or plural.

The battery 13 is a power supply source for each component of the electronic device 1, and supplies power to the electronic device 1. The camera module 18 images an object through the lens 5. The camera module 18 may be a camera module capable of capturing 8K images, 4K images, and full high definition (FHD) images.

The antenna module 19 is a component that performs communication such as wireless communication with the outside of the electronic device 1, and includes wireless-related components such as an antenna and a power amplifier. The antenna is preferably a component for accessing a 5G line, and more preferably a component capable of data communication using millimeter waves. Further, the antenna may be a component for accessing a line capable of data communication such as a 4G line.

The antenna module 19 may be provided near the cover glass 2, the side surface member 3, or the back surface member 4 so that the communication processing relating to the communication with the outside of the electronic device 1 is stabilized. In FIG. 1, the antenna module 19 is provided near the side surface member 3. The heat of the antenna module 19 is largely due to the heat of the power amplifier.

In the example of FIG. 1, heat generating components that generate heat inside the electronic device 1 include the driver circuit 7, the LED 9, the control device 10, the camera module 18, and the antenna module 19, for example. In the electronic device 1, all components that may affect the operation of the components of the electronic device or peripheral components by generating heat during operation correspond to heat generating components.

Here, for example, each of the driver circuit 7, the LED 9, and the control device 10 is referred to as a first heat generating component. The display panel D1 is also referred to as a first heat generating component. Examples of the first heat generating component also include a power supply circuit (not shown). The first heat generating component is a component with heat that is absorbed by the first metal plate 20, and operates during substantially an entire period of an operation period during which the electronic device 1 can receive an input operation of the user on the screen of the electronic device 1. It is to be noted that the component that operates during substantially an entire period also includes a component that operates during the entire period.

In the first heat generating component, it is not possible to set an operating state for ON/OFF even when the user operates the electronic device 1 in a state where the power of the electronic device 1 is ON and the electronic device 1 can receive the input operation of the user. Furthermore, each of the first heat generating components or one formed from an assembly of the first heat generating components is referred to as a first heat generating source.

When the electronic device 1 is, for example, a smartphone or a tablet, and the screen of the electronic device 1 is turned on, the electronic device 1 is can receive an input operation of the user on the screen of the electronic device 1. Examples of the input operation of the user include a touch operation. Therefore, the operation period is a period during which the screen of the electronic device 1 is turned on, specifically, a period during which the LED 9 is turned on.

According to the above configuration, the second metal plate 21 described below can absorb heat from a second heat generating source described below, which is composed of a second heat generating component described below that operates during a part of the period during which the screen of the electronic device 1 is turned on. Therefore, even in the electronic device 1 in which the screen is turned on, it is possible to easily implement the configuration for sufficiently absorbing and dissipating the heat of the heat generating component.

Furthermore, for example, each of the camera module 18 and the antenna module 19 is referred to as a second heat generating component. Examples of the second heat generating component also include a circuit used for communication with the outside of the electronic device 1. The second heat generating component is a component with heat that is absorbed by the second metal plate 21, and operates during a part of the operation period. In the second heat generating component, it is possible to set the operating state for ON/OFF by operation of the user on the electronic device 1 in the state where the power of the electronic device 1 is ON and the electronic device 1 can receive the input operation of the user.

Each of the second heat generating components or one formed from an assembly of the second heat generating components is referred to as a second heat generating source. That is, the second heat generating source includes at least the camera module 18 and the antenna module 19 as the second heat generating component. Thereby, even when the second metal plate 21 described below absorbs the heat of the camera module 18 and the antenna module 19, it is possible to easily implement the configuration for sufficiently absorbing and dissipating the heat of the camera module 18 and the antenna module 19.

The first metal plate 20 is made of a material having a thermal conductivity higher than that of the cover glass 2, the side surface member 3, and the back surface member 4. Therefore, the first metal plate 20 can absorb the heat generated inside the electronic device 1 in preference to the cover glass 2, the side surface member 3, and the back surface member 4. The first metal plate 20 is made of, for example, aluminum or aluminum alloy. The first metal plate 20 is disposed inside the electronic device 1.

The first metal plate 20 is a plate-shaped member that efficiently absorbs heat generated from the display panel D1 disposed above the first metal plate 20 (in the positive direction of the Z axis) and heat generated from the control device 10 disposed below the first metal plate 20 (in the negative direction of the Z axis). That is, the first metal plate 20 is a plate-shaped member as a first heat absorber that is provided on the back surface side (the negative direction side of the Z axis) of the display panel D1 and that absorbs the heat of the first heat generating source. The first metal plate 20 extends inside the electronic device 1, which is provided near the center thereof. Here, the first metal plate 20 may be disposed at a position where the heat generated from the first heat generating component can be efficiently absorbed.

The first heat absorber does not necessarily have to be the first metal plate 20, and may be a member having a thermal conductivity that is sufficient to absorb the heat generated inside the electronic device 1 and efficiently conduct the absorbed heat to the outside of the electronic device 1. The first heat absorber may be made of, for example, a thermal interface material (TIM) such as a resin such as silicone mixed with a heat conductive filler.

It is to be noted that the thermal conductivity of the material used as the first heat absorber may be relatively higher than that of the materials used as the cover glass 2, the side surface member 3, and the back surface member 4, for example, and may be 100 W/(m·K) or more. When the thermal conductivity of the material used as the first heat absorber is 100 W/(m·K) or more, the first heat absorber can efficiently conduct the absorbed heat to the inside or the outside thereof.

The thermal conductive member 17 is disposed between the first metal plate 20 and the control device 10. Specifically, the thermal conductive member 17 is disposed between the first metal plate 20 and the shield case 12. In this case, the thermal conductive member 17 conducts the heat generated from the control device 10 to the first metal plate 20. The thermal conductive member 17 is made of, for example, a thermal interface material (TIM). By disposing the thermal conductive member 17 with respect to the heat generating component such as the control device 10 directly connected to the first metal plate 20, the heat generated in the heat generating component can be efficiently conducted to the first metal plate 20.

On the other hand, the first heat dissipation sheets 14 and 15 and the second heat dissipation sheet 16, which will be described below, conduct heat to the inside and the outside while spreading the heat in a wide range. From this viewpoint, the thermal conductivity of the first heat dissipation sheets 14 and 15 and the second heat dissipation sheet 16 may be higher than that of the thermal conductive member 17.

The first heat dissipation sheet 14 is a heat dissipation member that is disposed near the driver circuit 7 and the LED 9 and that is attached to the surface of the backlight unit 8 that faces the first metal plate 20. In other words, the first heat dissipation sheet 14 is a heat dissipation member attached in a wide range over the surface of the backlight unit 8 opposite to the surface on the liquid crystal unit 6 side (the negative direction side of the Z axis). That is, the first heat dissipation sheet 14 is provided on the display panel D1.

Thereby, the first heat dissipation sheet 14 can absorb the heat generated from the driver circuit 7 and the LED 9. Further, the first heat dissipation sheet 14 can conduct the absorbed heat to an air layer formed between the first heat dissipation sheets 14 and 15. It is to be noted that the case where heat is transferred through an air layer in a narrow space is also expressed in the present specification using the term "conduction".

The first heat dissipation sheet 15 is a heat dissipation member that is attached to the surface of the first metal plate 20 facing the backlight unit 8. In other words, the first heat dissipation sheet 15 is a heat dissipation member attached in a wide range over the surface of the first metal plate 20 on the side opposite to the surface on the control device 10 side (the positive direction side of the Z axis). That is, the first heat dissipation sheet 15 is provided on the first metal plate 20.

Thereby, the first heat dissipation sheet 15 can absorb the heat from the air layer formed between the first heat dissipation sheets 14 and 15. Further, the first heat dissipation sheet 15 can conduct the absorbed heat to the first metal plate 20.

Therefore, the first heat dissipation sheets 14 and 15 conduct the heat of the display panel D1 to the first metal plate 20. Thereby, the heat of the first heat generating source is conducted to the first metal plate 20 by the first heat dissipation sheets 14 and 15, and moreover, since the first metal plate 20 is a plate-shaped member to ensure a sufficient heat dissipation area, it is possible to perform higher heat dissipation.

The second metal plate 21 absorbs the heat of the second heat generating source. The same heat dissipation member as the first metal plate 20 may be used for the second metal plate 21. The second metal plate 21 is disposed inside the electronic device 1. The second metal plate 21 has low thermal resistance only to the second heat generating source. Further, the second metal plate 21 is disposed at a position separated from the first metal plate 20. Since heat is difficult to be conducted between the second metal plate 21 and the third metal plate 22 and the first metal plate 20, even if the temperature of the first metal plate 20 rises, the second metal plate 21 and the third metal plate 22 can maintain a sufficiently low temperature.

According to the above configuration, heat transfer between the first metal plate 20 and the second metal plate 21 is reduced. Here, for example, it is assumed that, among various heat generating components, a component having a particularly large amount of heat is provided in the electronic device 1 as the second heat generating component. By controlling the second heat generating component so that the second metal plate 21 can sufficiently absorb the heat of the second heat generating source, the heat of the second heat generating component can be sufficiently absorbed and dissipated. Therefore, with the configuration of the electronic device 1, it is possible to easily implement the configuration for sufficiently absorbing and dissipating the heat of the heat generating component.

The second heat dissipation sheet 16 is a heat dissipation member provided on the camera module 18, the antenna module 19, the second metal plate 21, and the third metal plate 22. Specifically, the second heat dissipation sheet 16 is disposed over the camera module 18, the antenna module 19, the second metal plate 21, and the third metal plate 22.

Thereby, the second heat dissipation sheet 16 can conduct the heat of the camera module 18 and the antenna module 19 to the second metal plate 21 and the third metal plate 22. Therefore, the heat generated from the camera module 18 and the antenna module 19 can be conducted to the second metal plate 21 and the third metal plate 22 via the second heat dissipation sheet 16. Accordingly, the heat generated from the camera module 18 and the antenna module 19 can be efficiently absorbed and dissipated. A heat pipe or a vapor chamber may be used instead of the second metal plate 21 and the second heat dissipation sheet 16. In this case, the heat pipe and the vapor chamber function as a heat absorber.

Examples of the first heat dissipation sheets 14 and 15 and the second heat dissipation sheet 16 include graphite sheets. By using the graphite sheet, locally generated heat can be conducted to the entire graphite sheet. Therefore, the first heat dissipation sheets 14 and 15 and the second heat dissipation sheet 16 can conduct heat to the outside while spreading the heat.

In addition, the thermal conductivity of the material used as the first heat dissipation sheets 14 and 15 and the second heat dissipation sheet 16 may be a high value so that the absorbed heat can be efficiently conducted to the inside or the outside thereof. For example, as the material of the first heat dissipation sheets 14 and 15 and the second heat dissipation sheet 16, a material having a horizontal thermal conductivity of 1000 W/(m·K) or more may be used.

The second metal plate 21 and the third metal plate 22 each may be thermally connected to the battery 13 that supplies power to the electronic device 1. It is not indispensable that the second metal plate 21 and the third metal plate 22 are thermally connected to the battery 13, but hereinafter, a case where the second metal plate 21 and the third metal plate 22 are thermally connected to the battery 13 will be described as an example.

When the second metal plate 21 and the third metal plate 22 are thermally connected to the battery 13, the second metal plate 21 and the third metal plate 22 each are thermally connected to the battery 13 via the second heat dissipation sheet 16. That is, the heat absorbed by the second metal plate 21 and the third metal plate 22 is conducted to the battery 13 via the second heat dissipation sheet 16. At this time, the battery 13 functions as a heat absorber.

Thereby, since the heat absorbed by the second metal plate 21 and the third metal plate 22 can be dissipated from the battery 13, the heat dissipation effect can be further improved as compared with a case where the second metal plate 21 and the third metal plate 22 are not thermally connected to the battery 13. The second metal plate 21 may be in direct contact with the battery 13 without the second heat dissipation sheet 16.

The second metal plate 21 is provided on the side of the battery 13 that supplies power to the electronic device 1 opposite to the first metal plate 20 side (the negative direction side of the Z axis). In other words, the second metal plate 21 is provided on the back surface member 4 side of the battery 13. Thereby, since the battery 13 is present between the first metal plate 20 and the second metal plate 21, it is possible to restrain heat from being buffered between the first metal plate 20 and the second metal plate 21, and the heat dissipation effect can be enhanced. The third metal plate 22 is provided on the side of the antenna module 19 opposite to the side surface member 3 side (the positive direction side of the X axis).

Furthermore, the thermal conductive member 17 is disposed between the second heat dissipation sheet 16 and the camera module 18. In this case, the thermal conductive member 17 conducts the heat generated from the camera module 18 to the second heat dissipation sheet 16.

The first thermistor 23, the second thermistor 24, and the third thermistor 25 each are electrically connected to the control device 10. The first thermistor 23 may be built in the camera module 18 or provided in contact with the camera module 18. The first thermistor 23 is a device for detecting a first temperature of the camera module 18. The first thermistor 23 is disposed at a position separated from the camera module 18, but may be in a state where the first temperature of the camera module 18 can be indirectly predicted.

The second thermistor 24 may be built in the second metal plate 21 or provided in contact with the second metal plate 21. The second thermistor 24 is a device for detecting a second temperature of the second metal plate 21. The second thermistor 24 is disposed at a position separated from the second metal plate 21, but may be in a state where the second temperature of the second metal plate 21 can be indirectly predicted.

The third thermistor 25 may be built in the antenna module 19 or provided in contact with the antenna module 19. The third thermistor 25 is a device for detecting a third temperature of the antenna module 19. The third thermistor 25 is disposed at a position separated from the antenna module 19, but may be in a state where the third temperature of the antenna module 19 can be indirectly predicted.

Internal Configuration of Control Device 10

Figure 2:
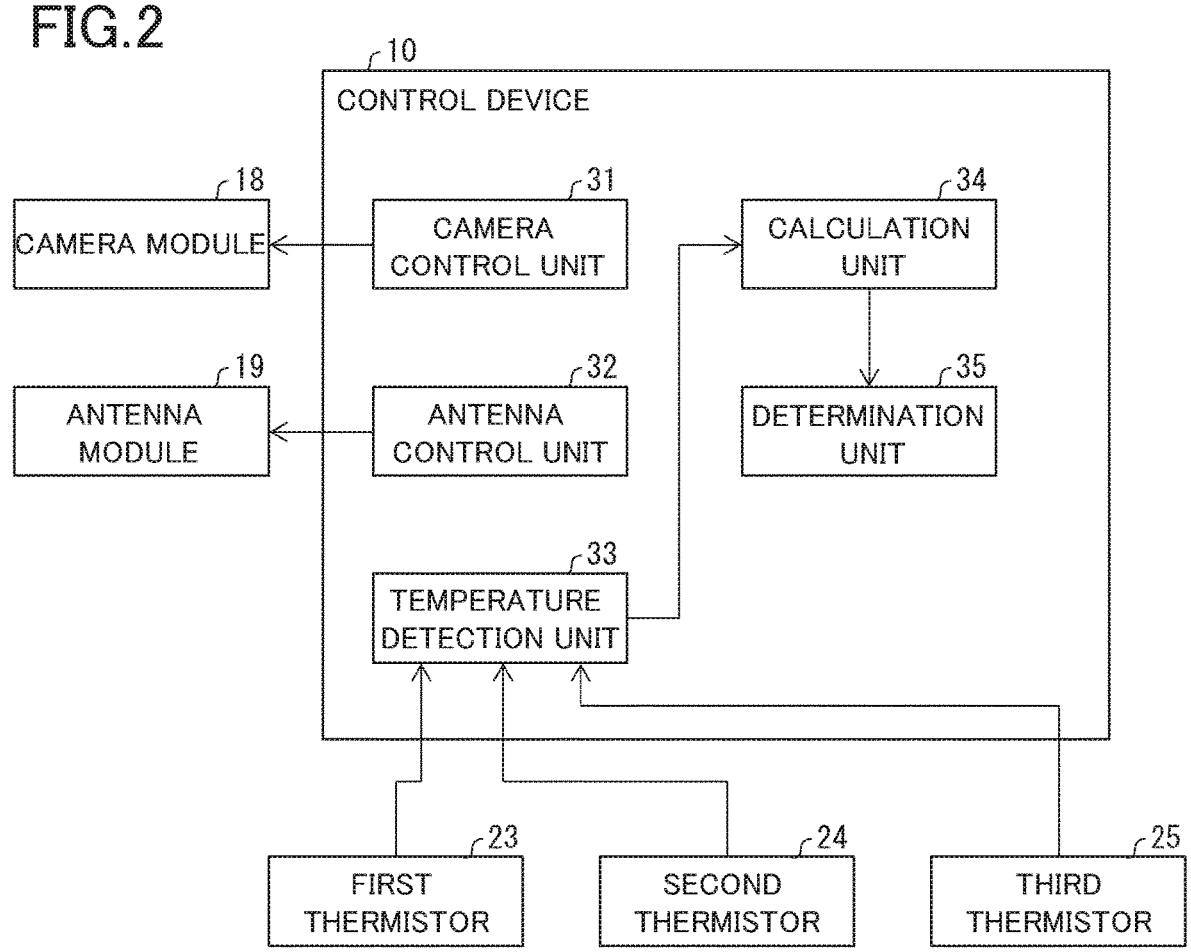
FIG. 2 is a block diagram showing an internal configuration of a control device included in the electronic device shown in FIG. 1.

FIG. 2 is a block diagram showing an internal configuration of the control device 10 included in the electronic device 1 shown in FIG. 1. As shown in FIG. 2, the control device 10 includes a camera control unit 31, an antenna control unit 32, a temperature detection unit 33, a calculation unit 34, and a determination unit 35. The camera control unit 31 controls the camera module 18. The antenna control unit 32 controls the antenna module 19.

The temperature detection unit 33 detects the first temperature of the camera module 18 based on a resistance value of the first thermistor 23. The temperature detection unit 33 detects the second temperature of the second metal plate 21 based on a resistance value of the second thermistor 24. The temperature detection unit 33 detects the third temperature of the antenna module 19 based on a resistance value of the third thermistor 25.

The calculation unit 34 calculates a first temperature difference between the first temperature and the second temperature and a second temperature difference between the third temperature and the second temperature. The determination unit 35 determines whether the first temperature difference is equal to or less than a first predetermined value, and determines whether the second temperature difference is equal to or less than a second predetermined value. Further, in Embodiment 2 described below, the determination unit 35 determines whether the first temperature difference is equal to or less than a third predetermined value.

Processing of Control Device 10

Figure 3:
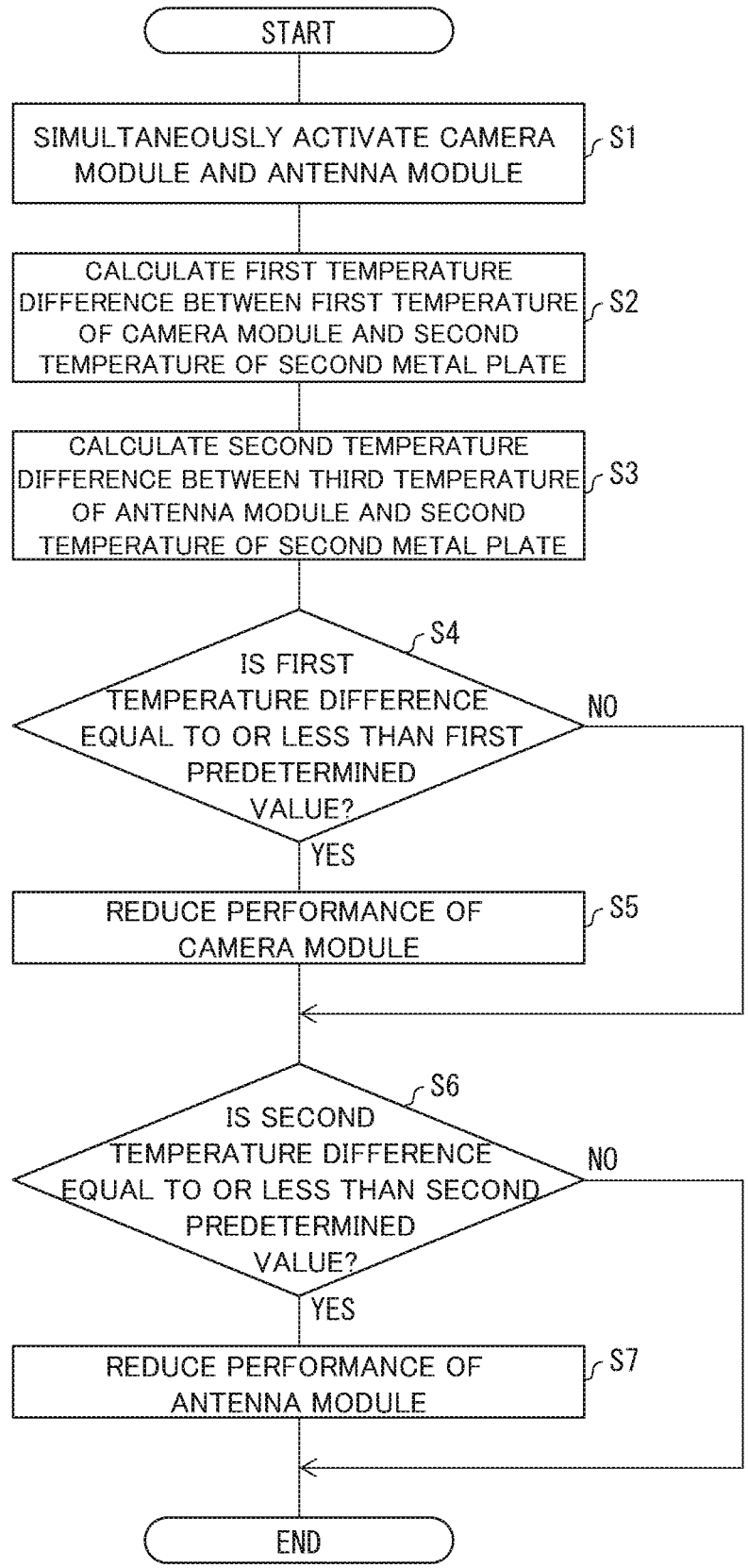
FIG. 3 is a flowchart showing an example of a processing procedure of the control device included in the electronic device shown in FIG. 1.

FIG. 3 is a flowchart showing an example of a processing procedure of the control device 10 included in the electronic device 1 shown in FIG. 1. As will be described below, the camera control unit 31, which will be described below, of the control device 10 performs a camera control process of controlling the camera module 18 according to the first temperature of the camera module 18 and the second temperature of the second metal plate 21 (camera control step). Further, the antenna control unit 32, which will be described below, of the control device 10 performs an antenna control process of controlling the antenna module 19 according to the third temperature of the antenna module 19 and the second temperature (antenna control step).

In the above-described configuration, for example, the control device 10 controls the camera module 18 so that the performance of the camera module 18 is reduced according to the first temperature of the camera module 18 and the second temperature of the second metal plate 21. Thereby, the second metal plate 21 can sufficiently absorb the heat of the camera module 18, and the heat of the camera module 18 can be sufficiently dissipated. The same applies to the antenna module 19. Accordingly, it is possible to easily implement the configuration for sufficiently absorbing and dissipating the heat of the camera module 18 and the antenna module 19. Details of the processing of the control device 10 will be described below.

As shown in FIG. 3, first, the control device 10 simultaneously activates the camera module 18 and the antenna module 19 (S1). Specifically, the camera control unit 31 activates the camera module 18, and the antenna control unit 32 activates the antenna module 19. Step S1 is executed when the input operation of the user on the screen of the electronic device 1 gives an instruction to activate an application using the camera module 18 and to activate the antenna module 19.

After the control device 10 simultaneously activates the camera module 18 and the antenna module 19, the temperature detection unit 33 detects the first temperature of the camera module 18, the second temperature of the second metal plate 21, and the third temperature of the antenna module 19. Then, the calculation unit 34 calculates a first temperature difference between the first temperature of the camera module 18 and the second temperature of the second metal plate 21 (S2: first calculation process). Further, the calculation unit 34 calculates a second temperature difference between the third temperature of the antenna module 19 and the second temperature of the second metal plate 21 (S3: second calculation process).

After the calculation unit 34 calculates the first temperature difference and the second temperature difference, the determination unit 35 determines whether the first temperature difference is equal to or less than a first predetermined value (S4). The first predetermined value is, for example, 5° C. When the first temperature difference is equal to or less than the first predetermined value (YES in S4), the camera control unit 31 controls the camera module 18 so as to reduce the performance of the camera module 18 (S5: camera control process).

Here, a case is considered where the camera module 18 is a camera module capable of capturing an 8K image. In this case, the process of reducing the performance of the camera module 18 by the camera control unit 31 is, for example, a process of changing an image quality mode of the camera module 18 from an 8K image mode to a 4K image mode or a FHD image mode. When the first temperature difference exceeds the first predetermined value (NO in S4), the process proceeds to step S6 described below.

Next, the determination unit 35 determines whether the second temperature difference is equal to or less than a second predetermined value (S6). The second predetermined value is, for example, 5° C. When the second temperature difference is equal to or less than the second predetermined value (YES in S6), the antenna control unit 32 controls the antenna module 19 so as to reduce the performance of the antenna module 19 (S7: antenna control process).

Here, a case is considered where the antenna module 19 includes an antenna for accessing a 5G line. In this case, the process of reducing the performance of the antenna module 19 by the antenna control unit 32 is, for example, a process of changing a communication mode of the antenna module 19 from a mode for accessing the 5G line to a mode for accessing a long term evolution (LTE) line. When the second temperature difference exceeds the second predetermined value (NO in S6), the processing of the control device 10 is ended.

It is to be noted that a case is considered where the performance of the camera module 18 is reduced by the camera control unit 31 in step S5. In this case, when the first temperature difference exceeds the first predetermined value, the camera control unit 31 controls the camera module 18 so that the performance of the camera module 18 is restored to the performance before the performance is reduced in step S5. For example, the camera control unit 31 changes the image quality mode of the camera module 18 from 4K image mode or the FHD image mode to the 8K image mode.

Further, a case is considered where the performance of the antenna module 19 is reduced by the antenna control unit 32 in step S7. In this case, when the second temperature difference exceeds the second predetermined value, the antenna control unit 32 controls the antenna module 19 so that the performance of the antenna module 19 is restored to the performance before the performance is reduced in step S7. For example, the antenna control unit 32 changes the communication mode of the antenna module 19 from the mode for accessing the LTE line to the mode for accessing the 5G line.

According to the configuration of the control device 10, the second metal plate 21 can sufficiently absorb the heat of the camera module 18 and the antenna module 19 in a state where both the camera module 18 and the antenna module 19 are operating. Further, the heat of the camera module and the antenna module can be sufficiently dissipated. Thereby, the electronic device 1 can be provided with the high-performance camera module 18 and the high-performance antenna module 19, and the electronic device 1 can stabilize the processing of the camera module 18 and the antenna module 19.

Further, specifically, since the heat generation amount of the camera module 18 can be reduced by reducing the performance of the camera module 18, the thermal energy transferred from the camera module 18 to the second metal plate 21 can be reduced. Even when the performance of the antenna module 19 is reduced, the thermal energy transferred from the antenna module 19 to the second metal plate 21 can be similarly reduced.

Accordingly, the first temperature difference between the first temperature of the camera module 18 and the second temperature of the second metal plate 21 becomes large, and more thermal energy can be transferred from the camera module 18 to the second metal plate 21. Also in the case of the antenna module 19, more thermal energy can be similarly transferred from the antenna module 19 to the second metal plate 21.

Furthermore, since the first temperature difference and the second temperature difference are easily kept substantially unchanged, it is possible to easily transfer the thermal energy from the camera module 18 and the antenna module 19 to the second metal plate 21. Thereby, it is possible to reduce the temperature rise on the surface of the housing of the electronic device 1.

When the antenna module 19 includes an antenna for accessing the 5G line, since immediacy is needed for communication in the antenna module 19, immediacy can be improved by stabilizing the communication processing, which is effective. Specifically, the communication on the 5G line can be immediately used without interruption of the communication during the communication on the 5G line due to the communication restriction caused by the temperature.

Further, a case is considered where the antenna module 19 is provided near the cover glass 2, the side surface member 3, and the back surface member 4. In this case, since the heat generated from the antenna module 19 can be sufficiently absorbed and dissipated, it is possible to reduce the occurrence of hot spots on the cover glass 2, the side surface member 3, and the back surface member 4. Similarly, in the case of the camera module 18, since the heat generated from the camera module 18 can be sufficiently absorbed and dissipated, it is possible to reduce the occurrence of hot spots on the lens 5.

Embodiment 2

Figure 4:
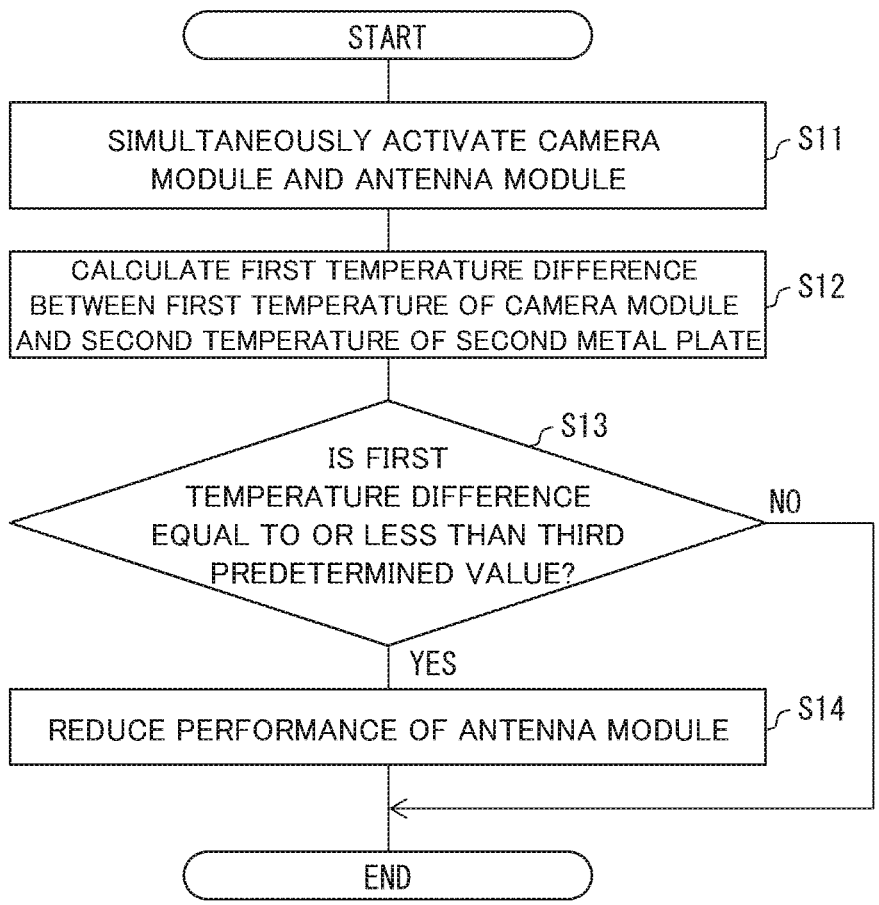
FIG. 4 is a flowchart showing an example of a processing procedure of a control device included in an electronic device according to Embodiment 2 of the present disclosure.

Embodiment 2 of the present disclosure will be described below. For convenience of description, members having the same functions as those described in Embodiment 1 will be denoted by the same reference numerals, and the description thereof will not be repeated. FIG. 4 is a flowchart showing an example of a processing procedure of a control device included in an electronic device according to Embodiment 2 of the present disclosure. The electronic device according to Embodiment 2 is different from the electronic device 1 according to Embodiment 1 in the processing content of the control device included therein.

The internal configuration of the control device according to Embodiment 2 is the same as the internal configuration of the control device 10 according to Embodiment 1. Therefore, FIG. 2 is referred so for the internal configuration of the control device according to Embodiment 2. The place where the control device according to Embodiment 2 is provided is the same as the place where the control device 10 is provided. As will be described below, an antenna control unit 32 of the control device according to Embodiment 2 performs an antenna control process of controlling the antenna module 19 according to the first temperature of the camera module 18 and the second temperature of the second metal plate 21.

In the above-described configuration, for example, the control device 10 controls the antenna module 19 so that the performance of the antenna module 19 is reduced according to the first temperature of the camera module 18 and the second temperature of the second metal plate 21. Thereby, the second metal late 21 can sufficiently absorb the heat of the camera module 18, and the heat of the camera module 18 can be sufficiently dissipated. Accordingly, it is possible to easily implement the configuration for continuing the operation while maintaining the performance of the camera module 18. Details of the processing of the control device according to Embodiment 2 will be described below.

As shown in FIG. 4, the control device according to Embodiment 2 executes steps S11, S12, S13, and S14 in this order. The processing of steps S11 and S12 is the same as the processing of steps S1 and S2 described above, respectively. After the processing of step S12, the determination unit 35 determines whether the first temperature difference between the first temperature of the camera module 18 and the second temperature of the second metal plate 21 is equal to or less than a third predetermined value (S13). The third predetermined value is, for example, 5° C.

When the first temperature difference is equal to or less than the third predetermined value (YES in S13), the antenna control unit 32 controls the antenna module 19 so as to reduce the performance of the antenna module 19 (S14: antenna control process). Here, the process of reducing the performance of the antenna module 19 by the antenna control unit 32 is, for example, a process of reducing the throughput of the antenna module 19. When the first temperature difference exceeds the third predetermined value (NO in S13), the processing of the control device 10 is ended.

With the configuration of the control device according to Embodiment 2, the second metal plate 21 can sufficiently absorb the heat of the camera module 18, and the heat of the camera module 18 can be sufficiently dissipated. Further, since the power consumption of the entire electronic device is suppressed by reducing the performance of the antenna module 19, the camera module 18 can continue to operate while maintaining its high performance. For example, the camera module 18 can continue to operate while maintaining the 8K image mode.

In addition, in step S13, it is more preferable that the determination unit 35 determines whether the first temperature difference is equal to or less than the third predetermined value and the first temperature of the camera module 18 exceeds a fourth predetermined value. The fourth predetermined value is, for example, 60° C. Thereby, the control device according Embodiment 2 can appropriately determine the timing at which the performance of the antenna module 19 is reduced.

Further, a case is considered where the performance of the antenna module 19 is reduced by the antenna control unit 32 in step S14. In this case, when the first temperature difference exceeds the third predetermined value, the antenna control unit 32 controls the antenna module 19 so that the performance of the antenna module 19 is restored to the performance before the performance is reduced in step S14. For example, the antenna control unit 32 increases the throughput of the antenna module 19.

Embodiment 3

Figure 5:
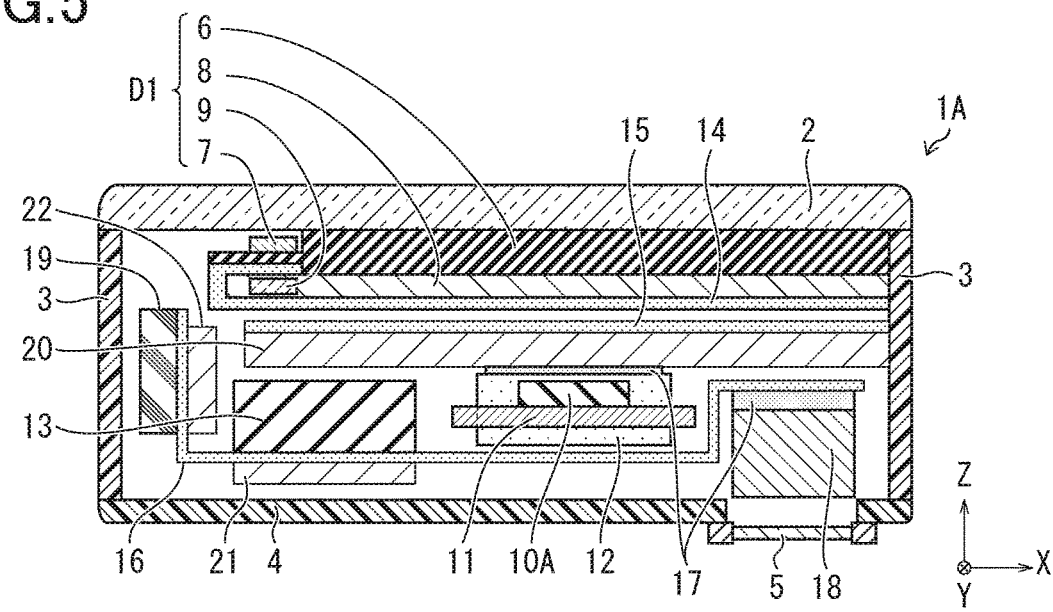
FIG. 5 is a cross-sectional view showing a cross-sectional configuration according to an example of an electronic device according to Embodiment 3 of the present disclosure.

Embodiment 3 of the present disclosure will be described below. For convenience of description, members having the same functions as those described in Embodiment 1 will be denoted by the same reference numerals, and the description thereof will not be repeated. FIG. 5 is a cross-sectional view showing a cross-sectional configuration according to an example of an electronic device 1A according to Embodiment 3 of the present disclosure.

As shown in FIG. 5, the electronic device 1A is different from the electronic device 1 in that the electronic device is does not include the first thermistor 23, the second thermistor 24, and the third thermistor 25, and the control device 10 is changed to a control device 10A. The control device 10A is different from the control device 10 in that the control device 10A does not include the temperature detection unit 33, the calculation unit 34, and the determination unit 35.

Figure 6:
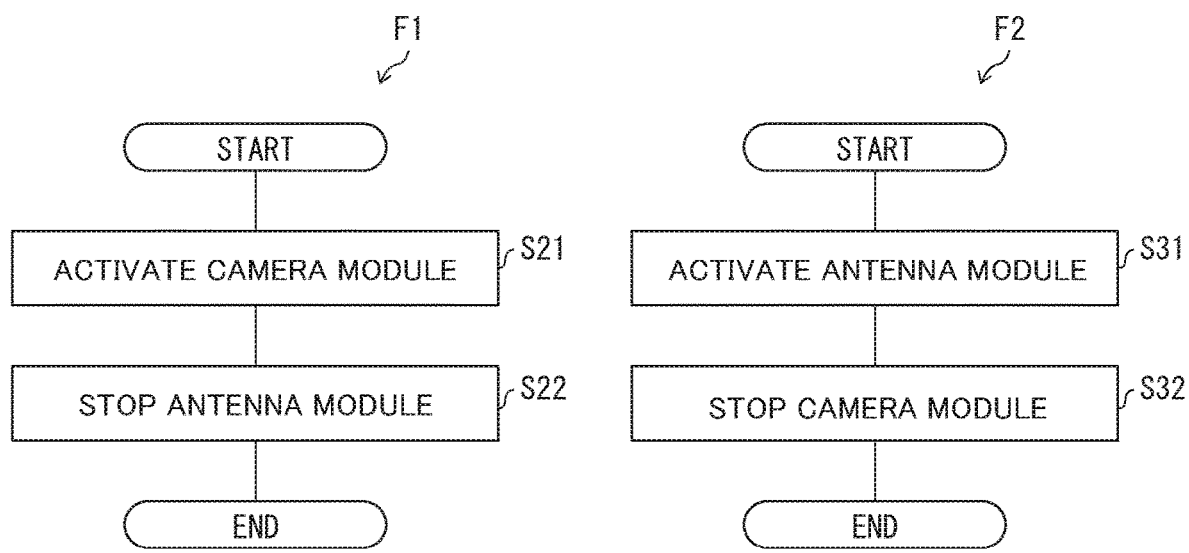
FIG. 6 is a flowchart showing an example of a processing procedure of a control device included in the electronic device shown in FIG. 5.

FIG. 6 is a flowchart showing an example of a processing procedure of the control device 10A included in the electronic device 1A shown in FIG. 5. The diagram shown by F1 in FIG. 6 is a diagram showing the processing contents of the control device 10A from the state where the antenna module 19 is activated. The diagram shown by F2 in FIG. 6 is a diagram showing the processing contents of the control device 10A from the state where the camera module 18 is activated.

First, a case is considered where the antenna module 19 is activated. In this case, as shown by F1 in FIG. 6, the camera control unit 31 of the control device 10A activates the camera module 18 (S21). After the camera control unit 31 activates the camera module 18, the antenna control unit 32 of the control device 10A controls the antenna module 19 so as to stop the antenna module 19 (S22).

Next, a case is considered where the camera module 18 is activated. In this case, as shown by F2 in FIG. 6, the antenna control unit 32 activates the antenna module 19 (S31). After the antenna control unit 32 activates the antenna module 19, the camera control unit 31 controls the camera module 18 so as to stop the camera module 18 (S32).

Therefore, the control device 10A performs a control process of controlling the camera module 18 and the antenna module 19 so as to stop at least one of the camera module 18 and the antenna module 19.

With the above configuration, the second metal plate 21 can sufficiently absorb the heat of the camera module 18 and the antenna module 19, and it is possible to easily implement a configuration for sufficiently dissipating the heat of the camera module and the antenna module. Thereby, the electronic device 1A can be provided with the high-performance camera module 18 and the high-performance antenna module 19, and the electronic device 1A can stabilize the processing of the camera module 18 and the antenna module 19.

Further, specifically, the camera module 18 and the antenna module 19 do not generate heat at the same time. Therefore, the temperature difference between the respective temperatures of the camera module 18 and the antenna module 19 and the second temperature of the second metal plate 21 becomes larger than that in the case where the camera module 18 and the antenna module 19 operate simultaneously. Thereby, thermal energy is easily transferred from the camera module 18 and the antenna module 19 to the second metal plate 21. Accordingly, the second temperature of the second metal plate 21 is unlikely to rise, and the heat of the camera module 18 and the antenna module 19 can be sufficiently dissipated.

Embodiment 4

Figure 7:
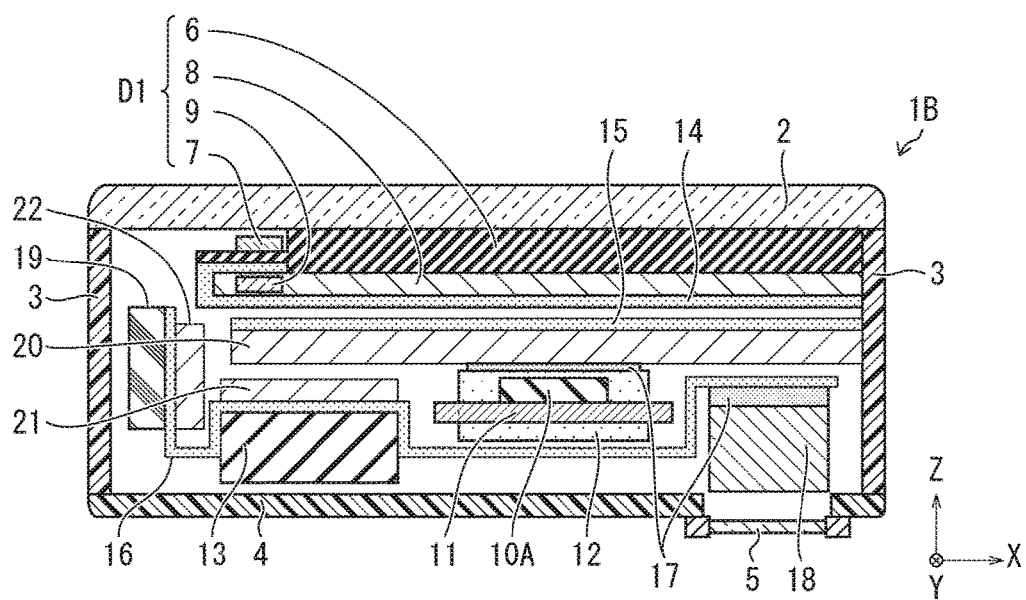
FIG. 7 is a cross-sectional view showing a cross-sectional configuration according to an example of an electronic device according to Embodiment 4 of the present disclosure.

Embodiment 4 of the present disclosure will be described below. For convenience of description, members having the same functions as those described in Embodiments 1 and 3 will be denoted by the same reference numerals, and the description thereof will not be repeated. FIG. 7 is a CXcross-sectional view showing a cross-sectional configuration according to an example of an electronic device 1B according to Embodiment 4 of the present disclosure.

As shown in FIG. 7, the electronic device 1B is different from the electronic device 1A in the arrangement of the battery 13 and the second metal plate 21. In the electronic device 1B, the second metal plate 21 is provided on the first metal plate 20 side (the positive direction side of the Z axis) of the battery 13. In other words, the second metal plate 21 is provided on the side of the battery 13 opposite to the back surface member 4 side. Thereby, it is possible to reduce the occurrence of hot spots on the back surface member due to the second metal plate 21.

Implementation Example by Software

The control blocks of the control device 10 or 10A (in particular, the camera control unit 31, the antenna control unit 32, the temperature detection unit 33, the calculation unit 34, and the determination unit 35) may be implemented by a logic circuit (hardware) formed on an integrated circuit (IC chip) or the like, or may be implemented by software.

In the latter case, the control device 10 or 10A includes a computer that executes instructions of a program that is software that implements each function. This computer includes, for example, at least one processor (control device) and at least one computer-readable recording medium that stores the program. Then, in the computer, the processor reads the program from the recording medium and executes the program to achieve the present disclosure. As the processor, for example, a central processing unit (CPU) can be used. As the recording medium, a "non-transitory tangible medium" such as a read only memory (ROM), a tape, a disk, a card, a semiconductor memory, a programmable logic circuit, or the like can be used.

Further, a random access memory (RAM) for expanding the program may be further provided. The program may be supplied to the computer via any transmission medium (communication network, broadcast wave, or the like) capable of transmitting the program. It is to be noted that one aspect of the present disclosure can also be implemented in the form of a data signal in which the program is embodied by electronic transmission and which is embedded in a carrier wave.

Conclusion

An electronic device according to Aspect 1 of the present disclosure includes: a first heat absorber that absorbs heat of a first heat generating source composed of a first heat generating component generating heat inside the electronic device, and operating during substantially an entire period of an operation period during which the electronic device is configured to receive an input operation of a user on a screen of the electronic device; and a second heat absorber that absorbs heat of a second heat generating source composed of a second heat generating component and that is disposed at a position separated from the first heat absorber, the second heat generating component operating during a part of the operation period.

In Aspect 2 of the present disclosure, the electronic device according to Aspect 1 above may be configured such that the second heat absorber absorbs the heat of the second heat generating source including at least a camera module for capturing an image of an object and an antenna module for communicating with an outside of the electronic device as the second heat generating component.

In Aspect 3 of the present disclosure, the electronic device according to Aspect 2 above may be configured to further include at least one control device as the first heat generating component, in which the control device performs a camera control process of controlling the camera module according to a first temperature of the camera module and a second temperature of the second heat absorber, and an antenna control process of controlling the antenna module according to a third temperature of the antenna module and the second temperature.

In Aspect 4 of the present disclosure, the electronic device according to Aspect 3 above may be configured such that the control device further performs a first calculation process of calculating a first temperature difference between the first temperature and the second temperature, and a second calculation process of calculating a second temperature difference between the third temperature and the second temperature, controls the camera module so as to reduce a performance of the camera module when the first temperature difference calculated in the first calculation process is equal to or less than a first predetermined value, in the camera control process, and controls the antenna module so as to reduce a performance of the antenna module when the second temperature difference calculated in the second calculation process is equal to or less than a second predetermined value, in the antenna control process.

In Aspect 5 of the present disclosure, the electronic device according to Aspect 2 above may be configured to further include at least one control device as the first heat generating component, in which the control device performs an antenna control process of controlling the antenna module according to a first temperature of the camera module and a second temperature of the second heat absorber.

In Aspect 6 of the present disclosure, the electronic device according to Aspect 5 above may be configured such that the control device further performs a first calculation process of calculating a first temperature difference between the first temperature and the second temperature, and controls the antenna module so as to reduce a performance of the antenna module when the first temperature difference calculated in the first calculation process is equal to or less than a third predetermined value, in the antenna control process.

In Aspect 7 of the present disclosure, the electronic device according to Aspect 2 above may be configured to further include at least one control device as the first heat generating component, in which the control device performs a control process of controlling the camera module and the antenna module so as to stop at least one of the camera module and the antenna module.

In Aspect 8 of the present disclosure, the electronic device according to any of Aspects 1 to 7 above may be configured such that the operation period is a period during which the screen of the electronic device is turned on.

A control device according to Aspect 9 of the present disclosure controls an electronic device including a camera module for capturing an image of an object and an antenna module for communicating with an outside of the electronic device. The control device includes: a camera control unit that controls the camera module according to a first temperature of the camera module and a second temperature of a heat absorber that absorbs heat of the camera module and the antenna module; and an antenna control unit that controls the antenna module according to a third temperature of the antenna module and the second temperature.

A control method of an electronic device according to Aspect 10 of the present disclosure is a control method of the electronic device including a camera module for capturing an image of an object and an antenna module for communicating with an outside of the electronic device. The method includes: controlling the camera module according to a first temperature of the camera module and a second temperature of a heat absorber that absorbs heat of the camera module and the antenna module; and controlling the antenna module according to a third temperature of the antenna module and the second temperature.

The electronic device according to each aspect of the present disclosure may be implemented by a computer. In this case, a program of the electronic device that causes the computer to implement the electronic device by operating the computer as each unit (software element) included in the electronic device, and a computer-readable recording medium recording the program also fall within the scope of the present disclosure.

The present disclosure is not limited to the above-described embodiments, various modifications can be made within the scope of the claims, and embodiments obtained by appropriately combining the technical means disclosed in the different embodiments are also included in the technical scope of the present disclosure. Furthermore, new technical features can be formed by combining the technical means disclosed in each embodiment.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An electronic device comprising:
   a first heat absorber that absorbs heat of a first heat generating source, the first heat generating source comprising a first heat generating component that generates heat inside the electronic device, the first heat generating component operating during substantially an entire operation period during which the electronic device is configured to receive an input operation of a user on a screen of the electronic device; and
   a second heat absorber that absorbs heat of a second heat generating source, the second heat generating source comprising a second heat generating component, the second heat absorber disposed at a position separated from the first heat absorber such that an air layer exists in an entire space interposed between the first heat absorber and the second heat absorber, the second heat generating component operating during a portion of the operation period.

2. The electronic device according to claim 1, wherein the operation period is a period during which the screen of the electronic device is turned on.

3. An electronic device comprising:
   a first heat absorber that absorbs heat of a first heat generating source, the first heat generating source comprising a first heat generating component that generates heat inside the electronic device, the first heat generating component operating during substantially an entire operation period during which the electronic device is configured to receive an input operation of a user on a screen of the electronic device; and a second heat absorber that absorbs heat of a second heat generating source, the second heat generating source comprising a second heat generating component, the second heat absorber disposed at a position separated from the first heat absorber, the second heat generating component operating during a portion of the operation period, wherein the second heat absorber includes at least a camera module for capturing an image of an object and an antenna module for communicating externally of the electronic device as the second heat generating component.

4. The electronic device according to claim 3, wherein:

the first heat generating component comprises at least one control device; and the at least one control device controls the camera module according to a first temperature of the camera module and a second temperature of the second heat absorber, and controls the antenna module according to the second temperature and a third temperature of the antenna module.

5. The electronic device according to claim 4, wherein the at least one control device further:

calculates a first temperature difference between the first temperature and the second temperature;

calculates a second temperature difference between the third temperature and the second temperature;

controls the camera module to reduce a performance of the camera module when the first temperature difference is equal to or less than a first predetermined value; and controls the antenna module to reduce a performance of the antenna module when the second temperature difference is equal to or less than a second predetermined value.

6. The electronic device according to claim 3, wherein:

the first heat generating component comprises at least one control device; and the at least one control device controls the antenna module according to a first temperature of the camera module and a second temperature of the second heat absorber.

7. The electronic device according to claim 6, wherein the at least one control device further:

calculates a temperature difference between the first temperature and the second temperature; and controls the antenna module to reduce a performance of the antenna module when the temperature difference is equal to or less than a predetermined value.

8. The electronic device according to claim 3, wherein:

the first heat generating component comprises at least one control device; and the at least one control device stops at least one of the camera module and the antenna module.

9. The electronic device according to claim 3, wherein the operation period is a period during which the screen of the electronic device is turned on.

10. A control device that controls an electronic device including a camera module for capturing an image of an object and an antenna module for communicating externally of the electronic device, the control device comprising:

a camera control unit that controls the camera module according to a first temperature of the camera module and a second temperature of a heat absorber that absorbs heat of both the camera module and the antenna module; and an antenna control unit that controls the antenna module according to the second temperature and a third temperature of the antenna module.

11. A control method of an electronic device including a camera module for capturing an image of an object and an antenna module for communicating externally of the electronic device, the method comprising:

controlling the camera module according to a first temperature of the camera module and a second temperature of a heat absorber that absorbs heat of both the camera module and the antenna module; and controlling the antenna module according to the second temperature and a third temperature of the antenna module.

* * * * *